(12) United States Patent
Tokuhisa et al.

(10) Patent No.: US 8,792,083 B2
(45) Date of Patent: Jul. 29, 2014

(54) SEED LIGHT GENERATION DEVICE, LIGHT SOURCE DEVICE, ADJUSTMENT METHOD THEREOF, LIGHT IRRADIATION DEVICE, EXPOSURE DEVICE, AND DEVICE MANUFACTURING METHOD

(75) Inventors: Akira Tokuhisa, Tokyo (JP); Naoto Inaba, Hiratsuka (JP)

(73) Assignee: Nikon Corporation, Tokyo (JP)

( * ) Notice: Subject to any disclaimer, the term of this patent is extended or adjusted under 35 U.S.C. 154(b) by 531 days.

(21) Appl. No.: 12/963,923

(22) Filed: Dec. 9, 2010

(65) Prior Publication Data

US 2011/0211184 A1 Sep. 1, 2011

Related U.S. Application Data

(63) Continuation of application No. PCT/JP2009/060273, filed on Jun. 4, 2009.

(30) Foreign Application Priority Data

Jun. 18, 2008 (JP) ................... 2008-159705

(51) Int. Cl.
*G03B 27/54* (2006.01)
*G03B 27/72* (2006.01)
*H01S 3/10* (2006.01)
*G03F 7/20* (2006.01)
*G02F 1/35* (2006.01)

(52) U.S. Cl.
CPC ............ *G03F 7/70025* (2013.01); *G02F 1/353* (2013.01)
USPC ................... 355/68; 355/69; 372/22

(58) Field of Classification Search
CPC . G03F 7/70025; G03F 1/353; H01S 5/06216; H01S 5/50; H01S 3/06754; H01S 5/0085
USPC ................ 355/67–69; 372/22, 92; 250/492.2
See application file for complete search history.

(56) References Cited

U.S. PATENT DOCUMENTS

| | | | |
|---|---|---|---|
| 7,136,402 B1 * | 11/2006 | Ohtsuki ......................... | 372/22 |
| 7,903,700 B2 * | 3/2011 | Nagai et al. ..................... | 372/20 |
| 2003/0081192 A1 * | 5/2003 | Nishi ............................ | 355/69 |

FOREIGN PATENT DOCUMENTS

JP A-2-103982 4/1990

(Continued)

OTHER PUBLICATIONS

International Search Report for International Patent Application No. PCT/JP2009/060273, mailed on Jul. 14, 2009 (w/ English translation).
Dec. 4, 2012 Japanese Office Action issued in Japanese Application No. 2008-159705.

(Continued)

*Primary Examiner* — Hung Henry Nguyen
(74) *Attorney, Agent, or Firm* — Oliff PLC

(57) ABSTRACT

A light source device including a seed light generation device, a light amplification unit which optically amplifies seed light generated by the seed light generation device, and a wavelength conversion unit which converts the wavelength of the light optically amplified by the light amplification unit. The seed light generation device includes a pulsed light generation unit which generates pulsed light having a single wavelength, a pulse modulation unit which selectively passes and extracts a part of the pulsed light, and a timing adjustment unit which relatively adjusts the extracting timing of the pulsed light by the pulse modulation unit during the generation period of the pulsed light by the pulse generation unit, according to an operation.

9 Claims, 6 Drawing Sheets

(56) References Cited

FOREIGN PATENT DOCUMENTS

| | | |
|---|---|---|
| JP | A-2004-335782 | 11/2004 |
| WO | WO 01/20397 A1 | 3/2001 |
| WO | WO 02/095486 A1 | 11/2002 |

OTHER PUBLICATIONS

Mar. 12, 2013 Japanese Office Action issued in Japanese Application No. 2008-159705.

Mar. 24, 2014 Office Action issued in Taiwanese Patent Application No. 098120187 (with translation).

* cited by examiner

SEED LIGHT GENERATION DEVICE, LIGHT SOURCE DEVICE, ADJUSTMENT METHOD THEREOF, LIGHT IRRADIATION DEVICE, EXPOSURE DEVICE, AND DEVICE MANUFACTURING METHOD

TECHNICAL FIELD

The present invention relates to a seed light generation device for generating seed light to be optically amplified, as well as a light source device, an adjustment method thereof, a light irradiation device, an exposure device and a device manufacturing method that use this seed light generation device.

TECHNICAL BACKGROUND

As a light source device for generating short wavelength light, such as light with a 193 nm wavelength, a light source device having a seed light generation device which generates seed light (single wavelength pulsed light in an infrared or visibile range) to be optically amplified, a light amplification unit which optically amplifies the seed light generated by the seed light generation device, such as an optical fiber amplifier, and a wavelength conversion unit which converts the wavelength of the light optically amplified by the light amplification unit, into a shorter wavelength, for example, is known (e.g. Patent Document 1).

This light source device is used for constituting a light irradiation device for irradiating light onto an object, along with an irradiation optical system for irradiating the light from this light source device onto the object (e.g. Patent Document 1). This light irradiation device is used for an exposure device for transferring a mask pattern onto a photosensitive object, various optical inspection devices, and a laser treatment device, for example (e.g. Patent Document 1).

The seed light generation device is comprised of a distributed feedback laser diode (DFB-LD) for continuous-wave output, and a pulse modulator which is constituted by an electro-optic modulator, which selectively passes and extracts a part of the continuous-wave output of the DFB-LD (Patent Document 1).

In the case of the above-mentioned light source device, it is known that self phase modulation (SPM), which is a kind of nonlinear optical phenomena, is generated in the light amplification unit, and the spectral width increases in the output of the light amplification unit and output of the wavelength conversion unit (output of the light source device) (e.g. Patent Document 1). Depending on the application, problems are generated due to this increase in spectral width. For example, in the case of using this light source device for an exposure device, chromatic aberration of the projection optical system increases, which deteriorates the image forming characteristic of the projection optical system, and drops the transfer accuracy of the mask pattern. In order to suppress the increase of the spectral width due to self phase modulation, Patent Document 1 proposes two methods. The first method disposes a phase modulator, which performs phase modulation on an appropriate position of an optical path in the above-mentioned light source device, so as to cancel at least a part of the self phase modulation of the light traveling the optical path. The second method superimposes a phase modulation signal, used for performing phase modulation to cancel at least a part of the self phase modulation, on a drive signal to be supplied to DFB-LD for continuous-wave output.

CITATION LIST

Patent Document

Patent Document 1: Republished International Patent Publication No. WO2002/095486

SUMMARY OF INVENTION

Problems to be Solved by the Invention

However in the case of a conventional seed light generation device, which obtains seed light of pulsed light by passing and extracting a part of the continuous-wave output of DFB-LD using a pulse modulator, such as an electro-optic modulator, some leakage light is output from the electro-optic modulator even in a state of continuous-wave output being shut off and seed light not being generated, because the pulse modulator, such as an electro-optic modulator, cannot make light transmittance to be completely 0% when light is shut off. Therefore in the case of a conventional light source device using a conventional seed light generation device, the leakage light, generated when the seed light is not being generated, is supplied to the light amplification unit. As a result, this leakage light is amplified, energy loss is generated, and such a problem as a drop in efficiency of the amplifier occurs.

In the case of using a light source device for an application where an increase in the spectral width causes a problem, it is demanded that the light source device can be set such that the increase in spectral width of the output can be decreased.

With the foregoing in view, it is an object of the present invention to provide a seed light generation device which can decrease the leakage light when the seed light is not being generated, and can adjust the spectral width of the output of a light source device when the light source device is constituted by this seed light generation device, and can be set, by this adjustment, such that the increase in the spectral width of the output is suppressed according to a method that is completely different from the self phase modulation cancellation method, which is used for a conventional light source device. It is another object of the present invention to provide a light source device, adjustment method thereof, light irradiation device, exposure device, and device manufacturing method using this seed light generation device.

Means to Solve the Problems

To solve the above problem, a seed light generation device according to a first aspect of the present invention is the seed light generation device which generates seed light to be optically amplified; comprising: a pulse generation unit which generates pulsed light having a single wavelength; a pulse modulation unit which selectively passes and extracts a part of the pulsed light; and a timing adjustment unit which relatively adjusts the extracting timing of the pulsed light by the pulse modulation unit during the generation period of the pulsed light by the pulse generation unit, according to an operation.

A seed light generation device according to a second aspect of the present invention is the seed light generation device according to the first aspect, wherein a range of the relative adjustment of the extracting timing during the generation period by the timing adjustment unit is a range that includes a timing when the part of the pulsed light becomes a part of a portion, of the pulsed light, where a light intensity decreases.

A seed light generation device according to a third aspect of the present invention is the seed light generation device according to the first or second aspect, wherein the pulse generation unit is a laser diode which generates the pulsed light in response to a pulsed electric signal.

A light source device according to a fourth aspect of the present invention comprises: the seed light generation device according to any one of the first to third aspects; a light amplification unit which optically amplifies the seed light generated by the seed light generation device; and a wavelength conversion unit which converts a wavelength of the light optically amplified by the light amplification unit.

A method for adjusting the light source device according to a fifth aspect of the present invention is a method for adjusting the light source device according to the fourth aspect, wherein the timing adjustment unit is operated so that the spectral width of the output light of the wavelength conversion unit becomes a desired spectral width, while observing the spectral width of the output light.

A method for manufacturing the light source device according to a sixth aspect of the present invention is a method for adjusting the light source device according to the fourth aspect, wherein the timing adjustment unit is operated while observing the spectral width and the temporal coherence length of the output light of the wavelength conversion unit, so that the spectral width of the output light becomes a desired spectral width, and the coherence length becomes a desired coherence length.

A light irradiation device according to a seventh aspect of the present invention is a light irradiation device for irradiating light onto an object, comprising: the light source device according to the fourth aspect; and an irradiation optical system which irradiates the light from the light source device onto the object.

An exposure device according to an eighth aspect of the present invention is an exposure device for transferring a pattern of a mask onto a photosensitive object, comprising: the light source device according to the fourth aspect; an irradiation optical system which irradiates the light from the light source device onto the mask; and a projection optical system which projects the light from the mask onto the photosensitive object.

A device manufacturing method according to a ninth aspect of the present invention is a device manufacturing method including a lithography step, and in the lithography step, the exposure device according to the eighth aspect is used to transfer a pattern of the mask onto the photosensitive object.

Advantageous Effects of the Invention

According to the present invention, a seed light generation device can be provided, with which the leakage light when the seed light is not being generated can be decreased, and the spectral width of the output of a light source device can be decreased when the light source device is constituted by the seed light generation device, and by this adjustment, setting can be performed such that the increase of the spectral width of the output is suppressed according to a method completely different from the self phase modulation cancellation method, which is used for a conventional light source device. The present invention can also provide a light source device, adjustment method thereof, a light irradiation device, an exposure device, and a device manufacturing method using this seed light generation device.

DESCRIPTION OF EMBODIMENTS

Using a pulsed light generation unit such as a pulse oscillating DFB-LD instead of a continuous-wave laser diode for a seed light generation device for generating seed light and obtaining a pulsed seed light by selectively passing and extracting a part of the pulsed light by a pulse modulation unit, makes it possible to dramatically decrease leakage light when the seed light is not being generated, since light is not input to the pulse modulation unit during most of the period when the seed light is not being generated.

However even if an expert in the art had this idea, an unintended phase modulation component to be superimposed on the seed light must be avoided according to conventional technical common sense, therefore the expert in the art could at most think of an idea of generating pulsed light having a much wider pulse width than a pulse width of seed light using a pulse oscillating DFB-LD or the like, and obtaining pulsed seed light extracted from the center portion (stable portion free of temporal change of intensity) of the generated pulsed light.

In spite of such a technical common sense, the present inventor discovered through research that spectral width of the output of the light source device can be changed by changing a timing of extracting a portion from a pulsed light generated by a pulse oscillating DFB-LD or the like as a seed light generation device so that the extracted portion is set to be a portion of the pulsed light where the intensity changes temporally. In particular, the present inventor discovered that the spectral width of the output of the light source device using the seed light generation device can be decreased when the extracted portion of the pulsed light, generated in the pulse generation unit, such as a pulse oscillating DFB-LD, is set to be a part of the portion, of the pulsed light, where the light intensity decreases. The quantitative description thereof is not easy, but this is probably because the portion where the light intensity decreases includes phase modulation components which cancel self phase modulation. The present invention was made based on this new knowledge discovered by the present inventor.

Now a seed light generation device, light source device, adjustment method thereof, light irradiation device, exposure device and device manufacturing method will be described with reference to the drawings.

First Embodiment

Figure 1:
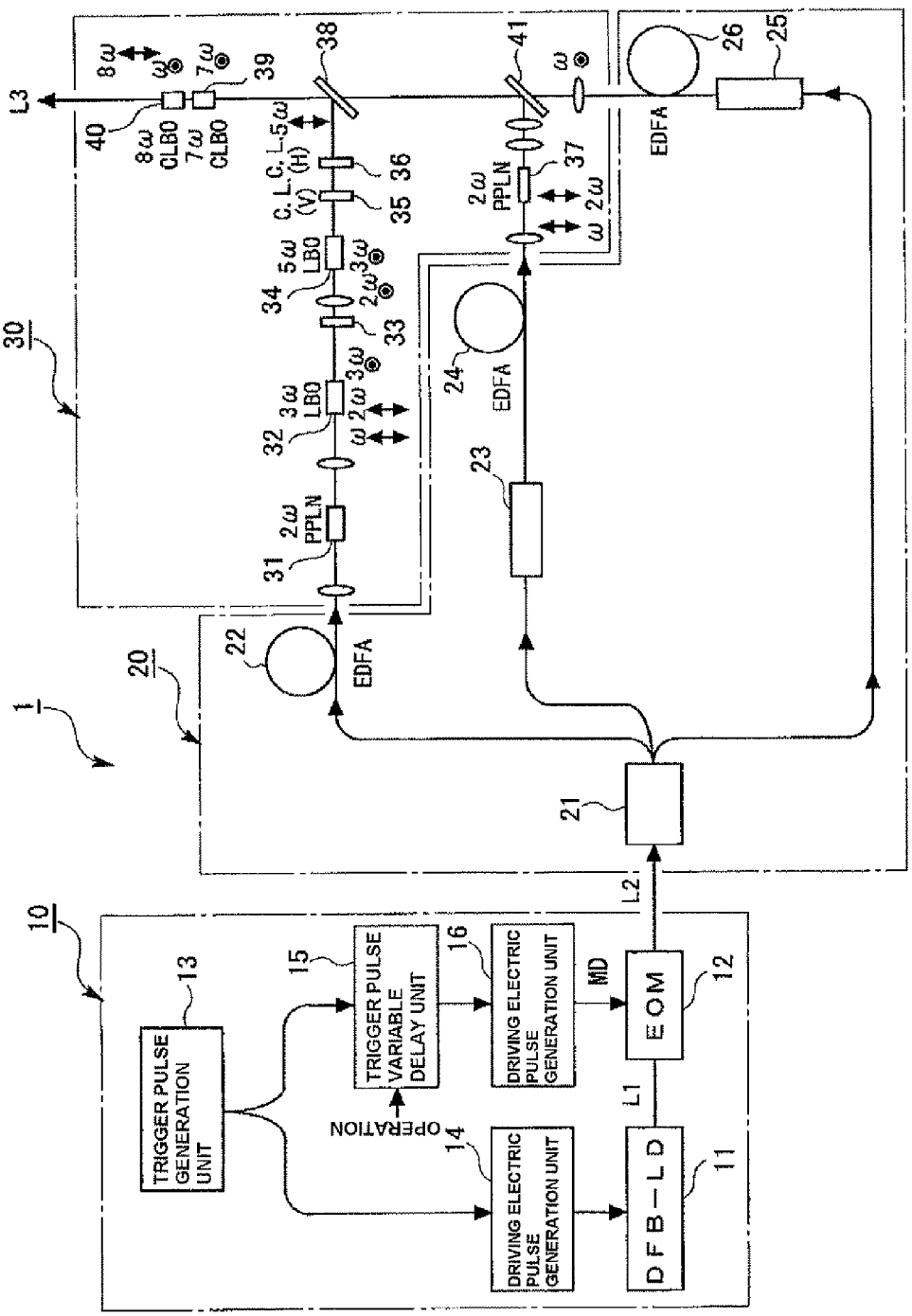
FIG. 1 is a diagram depicting a general configuration of a light source device according to a first embodiment of the present invention.

FIG. 1 is a diagram depicting a general configuration of a light source device 1 according to a first embodiment of the present invention. The light source device 1 according to the present embodiment has a seed light generation device 10 which generates seed light L2 to be optically amplified, a light amplification unit 20 which optically amplifies the seed light L2 generated by the seed light generation device 10, and a wavelength conversion unit 30 which converts the wavelength of the light optically amplified by the light amplification unit 20, and outputs ultraviolet pulsed light having a 193 nm wavelength as light source light (output light of the wavelength conversion unit 30) L3.

According to the present embodiment, the seed light generation device 10 has: a distributed feedback laser diode (DFB-LD) 11 as a pulse generation unit for generating pulsed light L1 having a single wavelength, in an infrared or visible range; an electro-optic modulator (EOM) 12 as a pulse modulation unit which selectively passes and extracts a part of the pulsed light L1 from the pulse generation unit (in this case DFB-LD 11), and driving electric pulse generators 14 and 16; and a trigger pulse variable delay unit 15.

For example, InGaAsP-DFB-LD of which oscillation wavelength is 1.544 µm and peak output is 20 mW is used for the DFB-LD 11. For the pulse generation unit, another laser diode, for example, which is driven by an electric signal may be used, or an optically pumped semiconductor laser which is driven by a signal other than an electric signal as a drive signal may be used instead of the DFB-LD 11.

The trigger pulse generator 13 generates a trigger pulse constituted by a square wave electric signal at a cyclic frequency of 1 kHz to 100 MHz, for example.

Figure 2:
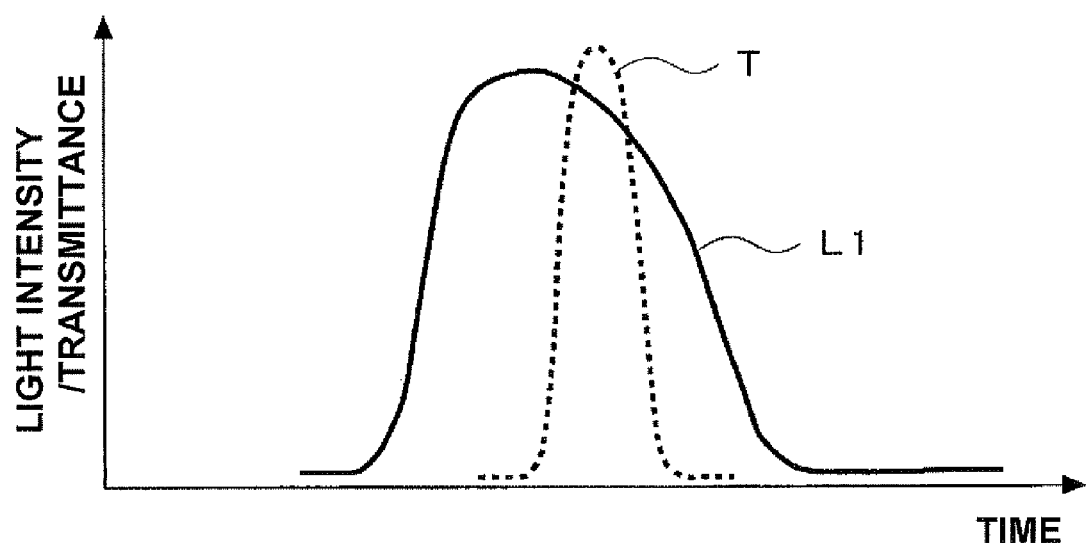
FIG. 2 is a graph depicting an example of a timing between pulsed light L1 generated by DFB-LD in FIG. 1 and a transmittance T of the EOM in FIG. 1.

The driving electric pulse generator 14 generates a driving electric pulse (pulsed electric current signal) for driving the DFB-LD 11, in response to a rise (or fall) of the trigger pulse from the trigger pulse generator 13. This driving electric pulse is a pulse having a Gaussian profile, for example. FIG. 2 shows an example of pulsed light L1 which the DFB-LD 11 generates by this driving electric pulse. FIG. 2 shows only one pulse of the pulsed light L1, but the pulsed light L1 is generated with the same cyclic frequency as the trigger pulse. The ordinate in FIG. 2 shows the light intensity of the pulsed light L1.

Figure 3:
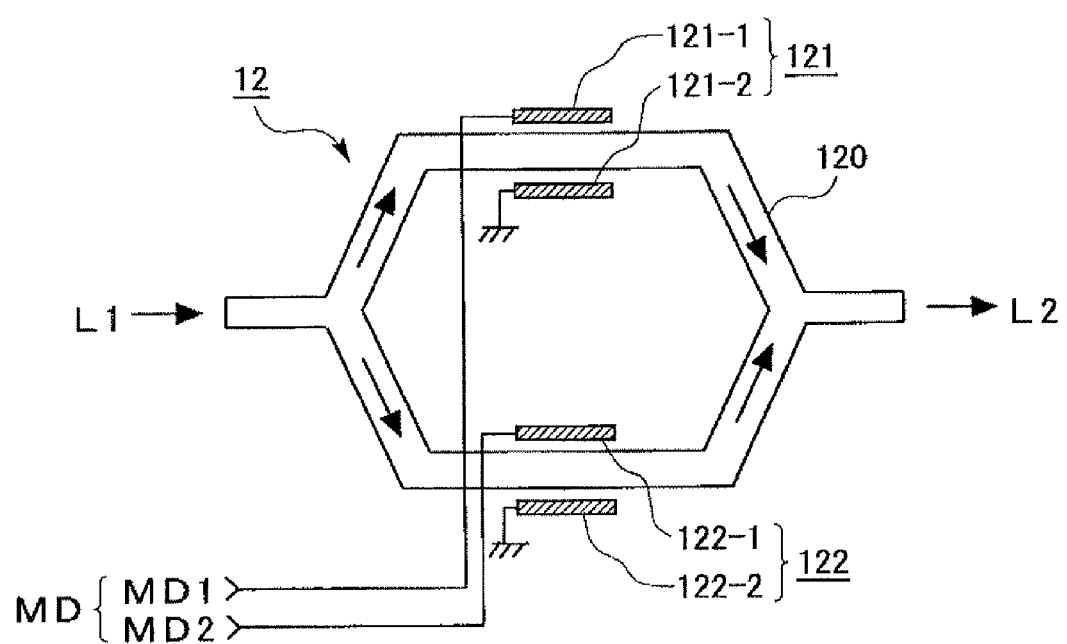
FIG. 3 is a diagram depicting a general configuration of example of the EOM in FIG. 1.

FIG. 3 is a diagram depicting a general configuration of an example of the EOM 12. According to the present embodiment, the EOM 12 has: a wave guide 120 in which an optical path for the entered light L1 to travel is branched into two wave guides, and then merged again, and electrodes 121 and 122 which are disposed for the branched two wave guides respectively. The wave guide 120 is constituted by a material of which refractive index changes where voltage is applied according to the applied voltage value. The electrode 121 consists of two electrode plates, 121-1 and 121-2, which are disposed sandwiching the wave guide, and a voltage signal MD1, which is one of the voltage signals constituting the driving electric pulse (pulse modulation signal) MD from the driving electric pulse generator 16, is supplied to the electrode 121 (more precisely, one electrode 121-1 of the two electrodes). Here the other electrode 121-2 is grounded. The electrode 122 consists of two electrode plates, 122-1 and 122-2, which are disposed sandwiching the wave guide, and a voltage signal MD2, which is the other voltage signal constituting the driving electric pulse (pulse modulation signal) MD from the driving electric pulse generator 16, is supplied to the electrode 122 (more precisely, one electrode 122-1 of the two electrodes). Here the other electrode 122-2 is grounded.

In the description herein below, the voltage signal MD1 and the voltage signal MD2 are generically called "pulse modulation signal MD". The lengths of the two branched optical paths of the wave guide 120 are set so that the transmittance (L2/L1) of the EOM 12 is the minimum value when the voltage is not being applied to both electrodes 121 and 122. By mutually different voltage signals which are applied to the electrodes 121 and 122 respectively, the transmittance of the EOM 12 becomes a value corresponding to the difference of these applied voltages.

Figure 4:
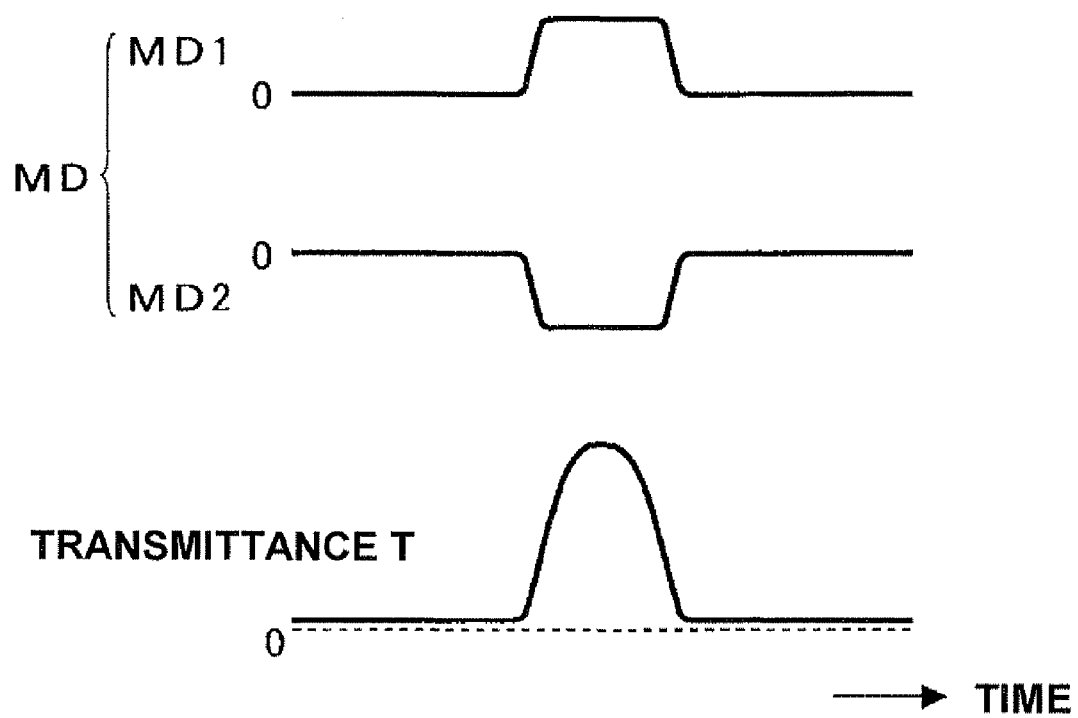
FIG. 4 is a diagram depicting the relationship of pulse modulation signals supplied to the EOM in FIG. 3 and the transmittance of the EOM in FIG. 3.

FIG. 4 is a diagram depicting a relationship of the pulse modulation signal MD (voltage signals MD1 and MD2), which is supplied from the driving electric pulse generator 16 to the EOM 12 and the transmittance T of the EOM 12. If both of the voltage signals MD1 and MD2 are 0V, the transmittance T of the EOM 12 is virtually zero. If a positive voltage pulse signal is supplied as the voltage signal MD1 and a negative voltage pulse signal is supplied as the voltage signal MD2 synchronizing with the voltage signal MD1, the transmittance T of the EOM 12 becomes a high transmittance in accordance with the difference between the voltage level of the voltage signal MD1 and the voltage level of the voltage signal MD2.

For the pulse modulation unit, an acoustic optical modulator (ACM), for example, may be used instead of the EOM 12.

The trigger pulse variable delay unit 15 manually delays a trigger pulse from the trigger pulse generator 13 with a delay amount which can be changed within a predetermined range. For the trigger pulse variable delay unit 15, a commercial variable length transmission line of which effective transmission line length can be manually changed, or various delay circuits of which delay amount can be manually changed within a predetermined range, can be used.

The driving electric pulse generator 16 generates a pulse modulation signal MD (voltage signals MD1 and MD2) which sets the transmittance T of the EOM 12 to high transmittance, that is, generates the voltage signal MD1 of the positive voltage pulse signal and the voltage signal MD2 of the negative voltage pulse signal, in response to the rise (or fall) of the delayed trigger pulse from the trigger pulse variable delay unit 15. The pulse width of the pulse modulation signal MD, to set the transmittance T of the EOM 12 to high transmittance, is set to be narrower than the pulse width of the pulsed light L1 from the DFB-LD 11, so that the EOM 12 selectively passes and extracts a part of the pulsed light L1 from the DFB-LD 11. The pulsed light which passes through the EOM 12 is supplied to the light amplification unit 20 as seed light L2, which is the output of the seed light generation device 10. The pulse width of the pulsed light L1 is about 1 ns to 2 ns, for example, and the pulse width of the pulse modulation signal MD is about 0.3 ns, for example.

FIG. 2 also shows the transmittance T of the EOM 12, along with the pulsed light L1 generated by the DFB-LD 11, in the case of adjusting the delay amount of the trigger pulse by the trigger pulse variable delay unit 15 to a predetermined value. The ordinate in FIG. 2 shows the transmittance T of the EOM 12 in this case.

According to this embodiment, the trigger pulse variable delay unit 15 constitutes a timing adjustment unit, which relatively adjusts the extracting timing of the pulsed light L1 by the pulse modulation unit 12 during the generation period of the pulsed light L1 by the pulse generation unit 11 according to the operation. This timing adjustment unit, however, is not limited to the trigger pulse variable delay unit 15. For example, if the optical path length between the DFB-LD 11 and the EOM 12 is designed to be variable as an optical delay line, the extracting timing can be effectively adjusted. As a most primitive method, the physical length of the electric cable connecting the driving electric pulse generator 16 and the EOM 12, for example, may be changed, whereby the timing can also be adjusted.

It is preferable to set an adjustable range of the delay amount of the trigger pulse variable delay unit 15, so as to include the delay amount to generate a timing in which the portion extracted by the EOM 12 (portion overlapping with high transmittance T) in the pulsed light L1 becomes a part of the position where the light intensity of the pulsed light L1 decreases, as shown in FIG. 2, in order that the spectral width of the light source light (output of the wavelength conversion unit 30) L3 can be as narrow as possible.

As FIG. 1 shows, according to this embodiment, the light amplification unit 20 has: a coupler 21, which branches the seed light (fundamental wave) L2 from the seed light generation device 10 into three; a first EDFA 22 which is a light amplifier for amplifying one of the branched lights; a delay unit 23 which delays another one of the branched lights; a second EDFA 24 which is a light amplifier for amplifying the light delayed by the delay unit 23; a delay unit 25 which delays the other one of the branched lights; and a third EDFA 26 which is a light amplifier for amplifying the light delayed by the delay unit 25.

Now the wavelength conversion unit 30 will be described with reference to FIG. 1. In FIG. 1, an elliptical symbol indicates a collimator lens or collective lens, of which description is omitted here. In FIG. 1, P-polarized light is indicated by an arrow, S-polarized light is indicated by a o with a dot inside, a fundamental wave is indicated by $\omega$, and an nth harmonic wave is indicated by n$\omega$.

As FIG. 1 shows, the fundamental wave of the P-polarized light amplified by the first EDFA 22 enters a first second harmonic wave forming optical element (PPLN crystal) 31, and from the first second harmonic wave forming optical element 31 a P-polarized second harmonic wave is generated along with the fundamental wave. This fundamental wave and the second harmonic wave enter a third harmonic wave forming optical element (LBO crystal) 32. From the third harmonic wave forming optical element 32, an S-polarized third harmonic wave is generated along with the fundamental wave and the second harmonic wave. For the second harmonic wave forming optical element 32, not only PPLN crystal, but also PPKTP crystal, PPSLT crystal or LBO crystal, for example, can be used.

These lights pass through a dual-wavelength wave plate 33 so that only a second harmonic wave is converted into S-polarized light. For the dual-wavelength wave plate, a wave plate constituted by a uniaxial crystal plate, which is cut in parallel with the optical axis of the crystal, is used. The wave plate is cut such that the thickness of the wave plate (crystal) is equal to integral multiple of $\lambda/2$ with respect to one wavelength light and to integral multiple of $\lambda$ with respect to the other wavelength light, so that the polarization is rotated with respect to one wavelength light (second harmonic wave), and polarization does not rotate with respect to the other wavelength light. Then the second harmonic wave and third harmonic wave, both now S-polarized lights, enter a fifth harmonic wave forming optical element (LBO crystal) 34. From the fifth harmonic wave forming optical element 34, a P-polarized fifth harmonic wave is generated along with the second harmonic wave and third harmonic wave. The P-polarized fundamental wave transmits through the fifth harmonic wave forming optical element 34.

The fifth harmonic wave generated from the fifth harmonic wave forming optical element 34 has an elliptical cross-sectional profile because of walk off, and cannot be directly used for the next wavelength conversion since the converging characteristics are poor. Therefore this elliptical cross-sectional profile is shaped to be circular by using the cylindrical lenses 35 and 36. For the fifth harmonic wave forming optical element 34, BBO crystal or CBO crystal can also be used.

The P-polarized fundamental wave amplified by the second EDFA 24 enters a second harmonic wave forming optical element (PPLN crystal) 37, and from the second harmonic wave forming optical element 37, a P-polarized second harmonic wave is generated along with the fundamental wave. Instead of PPLN crystal, PPKTP crystal, PPSLT crystal, LBO crystal or the like may be used.

The S-polarized fundamental wave amplified by the third EDFA 26 is combined with the above-mentioned P-polarized second harmonic wave by a dichroic mirror 41. In this example, the dichroic mirror 41 transmits the fundamental wave and reflects the second harmonic wave. The combined S-polarized fundamental wave and the P-polarized second harmonic wave are combined with the above-mentioned P-polarized fifth harmonic wave by a dichroic mirror 38. In this example, the dichroic mirror 38 transmits the fundamental wave and the second harmonic wave, and reflects the fifth harmonic wave. For this combining of lights, a bulk type optical element can be used, such as a color separating/combining mirror (dichroic mirror), or reflection or transmission diffractive optics can be used.

The combined S-polarized fundamental wave, P-polarized second harmonic wave and P-polarized fifth harmonic wave enter a seventh harmonic wave forming optical element (CLBO crystal) 39, and from the seventh harmonic wave forming optical element 39, an S-polarized seventh harmonic wave is generated along with these lights. These lights enter an eighth harmonic wave forming optical element (CLBO crystal) 40, where the S-polarized fundamental wave and the S-polarized seventh harmonic wave are combined, and a P-polarized eighth harmonic wave is generated. To separate only the eighth harmonic wave having a 193 nm wavelength from the lights having other wavelengths which are emitted from the eighth harmonic wave forming optical element 40, a dichroic mirror, polarization beam splitter or prism is used. According to this embodiment, an eighth harmonic wave having a 193 nm wavelength is separated from the lights emitted from the eighth harmonic wave forming optical element 40 by a dichroic mirror, polarization beam splitter or prism, which is not illustrated, and is used as the light source light L3.

According to the present embodiment, a timing for the EOM 12 to selectively pass and extract a part of the pulsed light L1 generated in the DFB-LD 11 is changed by operating the trigger variable delay unit 15, and the extracted portion is changed to a portion in the pulsed light L1 where the intensity changes temporally, for example, whereby the spectral width of the output L3 of the light source device 1, using the seed light generation device 10, can be changed. In particular, the spectral width of the output L3 of the light source device 1 using the seed light generation device 10 can be decreased by setting the extracting portion of the pulsed light L1 generated in the DFB-LD 11 to be a part of the portion, of the pulsed light L1, where the light intensity decreases as shown in FIG. 2. The reason is not completely clear, but is probably because the portion where the light intensity decreases includes phase modulation components to cancel the self phase modulation.

The present inventor actually manufactured a light source device the same as the light source device 1 according to this embodiment, changed the delay amount by operating the trigger pulse variable delay unit 15, observed the light intensity waveform of the pulsed light L1 from the DFB-LD 11 and the light intensity waveform of the seed light L2 using a photodetector and oscilloscope, and measured E95 (spectral width where 95% of the energy of the whole spectral concentrates) of the light source light L3 (ideal wavelength is 193 nm) using a spectrometer. Here the pulse width of the pulsed light L1 from the DFB-LD 11 is about 1.5 ns, and the pulse width of the seed light L2, extracted by the EOM 12, is approximately 0.3 ns.

Figure 5:
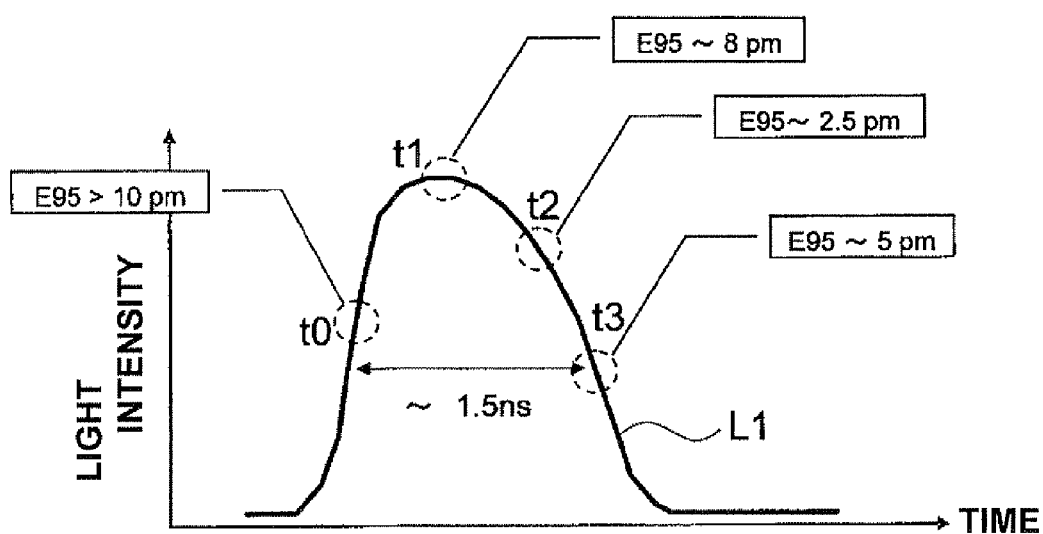
FIG. 5 is a graph showing the measurement result.

FIG. 5 is a graph showing the measurement result thereof. FIG. 5 shows the timing of the pulse center of the seed light L2 during the pulsed light L1 from the DFB-LD 11, according to each delay amount of the trigger pulse variable delay unit 15, with t0 to t3 as the indexes to show the extraction timing in the pulsed light L1. At timing t0 to extract the portion where light intensity increases in the pulsed light L1, E95 is 10 pm or more, which is very wide. At timing t1 to extract a portion around the peak in the pulsed light L1, E95 decreases to about 8 pm, and at time t2 to extract a portion close to the decreasing portion in the pulsed light L1, E95 is about 2.5 pm, which is very narrow. At timing t3, which is a further later timing, E95 becomes 5 pm, that is, E95 becomes wider again.

As confirmed by experiment, by relatively adjusting the timing to extract the pulsed light L2 during the generation period of the pulsed light L1 like this, the spectral width of the light source light L3 can be changed, and the spectral width of the light source light L3 can be adjusted from a very narrow width to a very wide width.

The adjustable range of the trigger pulse variable delay unit 15 can be determined according to the spectral width demanded for the application of the light source device 1. For example, if an extremely narrow spectral width is demanded for the light source light L3, such as a case of using the light source device 1 for a later mentioned exposure device, the range t1 to t3 is set to be an adjustable range in the example in FIG. 5. If changing the spectral width of the light source light L3 from a very narrow range to a very wide range is demanded, on the other hand, the range t0 to t3 can be set to be an adjustable range, for example, in the example in FIG. 5.

If the light source device 1 is used for an application where the spectral width of the light source light L3 is simply set to a desired spectral width, such as a case of setting the spectral width of the light source light L3 to be extremely narrow, the adjustment by the trigger pulse variable delay unit 15 can be performed as follows, for example. That is, in this case, the trigger pulse variable delay unit 15 is operated, while observing the spectral width of the light source light L3 using a spectrometer, so that the spectral width becomes the desired spectral width (e.g. narrowest spectral width).

If the light source device 1 is used for an application (e.g. specific optical inspection device), in which a certain degree of a narrow spectral width of the light source light L3 is demanded, and at the same time, a speckle, occurring in a case of too long temporal spectral width, becomes a problem, adjustment by the trigger pulse variable delay unit 15 can be performed as follows, for example. That is, in this case, the trigger pulse variable delay unit 15 is operated, while observing the spectral width of the light source light L3 using a spectrometer, and also observing the temporal coherence length of the light source light L3 using an interferometer, so that the spectral width becomes a desired spectral width, and the coherence length becomes a desired coherence length. The temporal coherence length is approximately in proportion to the inverse of the spectral width, therefore the temporal coherence length can be changed by operating the trigger pulse variable delay unit 15.

Furthermore, according to the present embodiment, the DFB-LD 11 which outputs not a continuous wave but pulsed light L1 is used, and the seed light L2 of the pulsed light is obtained by selectively passing and extracting a part of the pulsed light L1 by the EOM 12, therefore light is not input to the EOM 12 in most of the period when the seed light L2 is not being generated, and leakage light, when the seed light L2 is not being generated, can be dramatically decreased. As a result, an energy loss in the light amplification unit 20 can be decreased, and highly efficient operation can be implemented.

As described above, according to this embodiment, leakage light, when the seed light is not being generated, can be decreased, and the spectral width of the output L3 of the light source device 1 can be adjusted, and it can be set so that by this adjustment, an increase in the spectral width of the output L3 of the light source device 1 is suppressed according to a method completely different from the self phase modulation cancellation method, which is used for the conventional light source device.

Instead of the light amplification unit 20, various light amplification units can be used, such as a light amplification unit disclosed in FIG. 5 of Patent Document 1 (Republished International Patent Publication No. WO2002/095486). Instead of the wavelength conversion unit 30, various wavelength conversion units can be used, such as a wavelength conversion unit disclosed in FIG. 7 of Patent Document 1.

Second Embodiment

Figure 6:
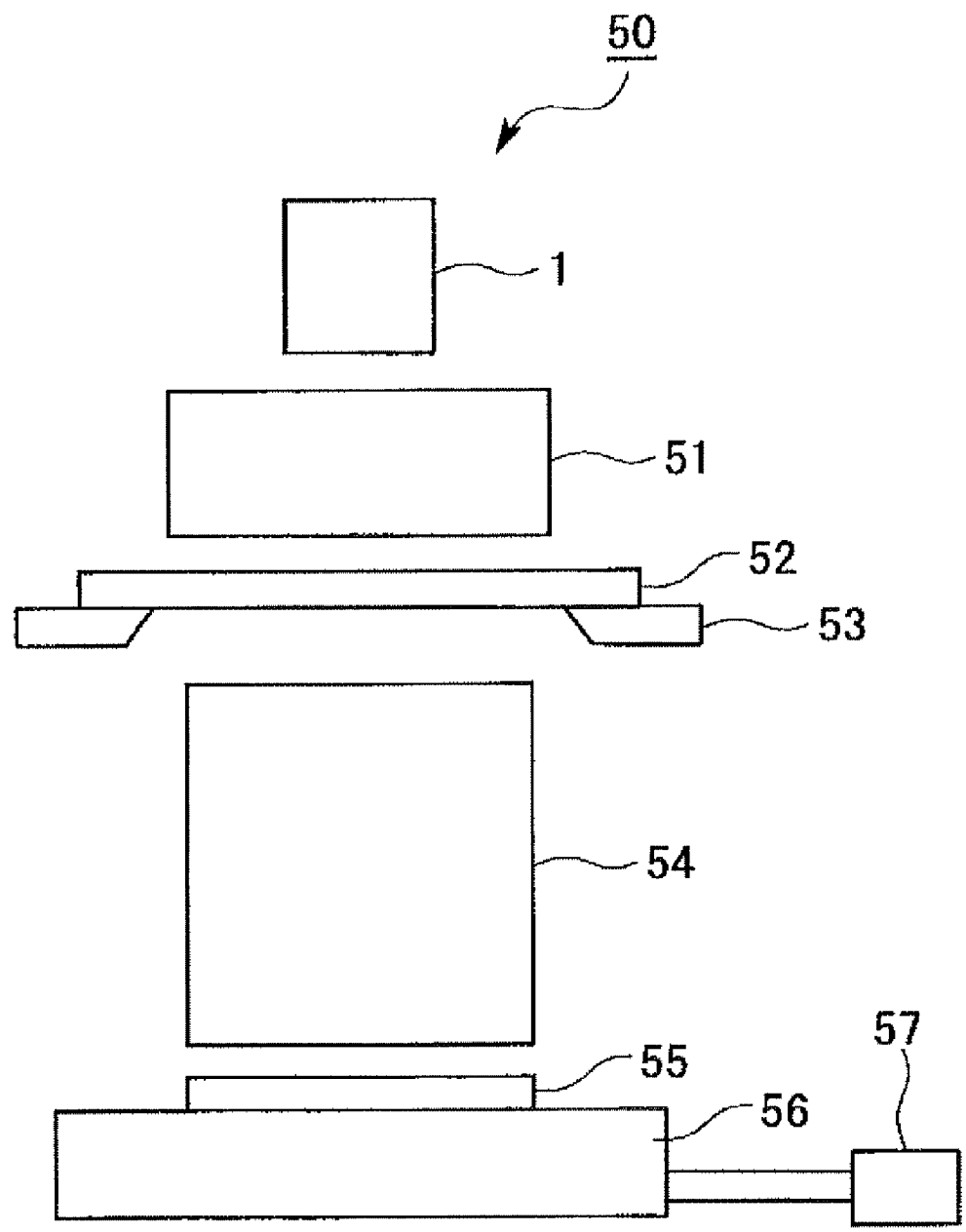
FIG. 6 is a diagram depicting a general configuration of an exposure device according to a second embodiment of the present invention.

FIG. 6 is a diagram depicting a general configuration of an exposure device 50 according to a second embodiment of the present invention. The exposure device 50 according to this embodiment is constituted by the light source device 1 of the first embodiment, and is used for a photolithography step, which is one of the semiconductor manufacturing steps. The exposure device used for the photolithography step is theoretically the same as photo-engraving, where a device pattern (mask pattern), accurately drawn on a photomask (reticle), is optically projected and transferred onto a semiconductor wafer, glass substrate or the like on which photoresist is coated.

The exposure device 50 according to this embodiment has: the above-mentioned light source device 1; an irradiation optical system (illumination optical system) 51; a mask support 53 for supporting a photomask (reticle) 52; a projection optical system 54, a stage 56 which mounts and supports a semiconductor wafer 55 as a photosensitive object to be exposed; and a driving device 57 which horizontally moves the stage 56.

In this exposure device 50, the light source light L3, which is output from the above-mentioned light source device 1, is input to the irradiation optical system 51 constituted by a plurality of lenses, and irradiate, through this irradiation optical system 51, the entire surface of the photomask 52, which is supported by the mask support 53. According to this embodiment, the light source device 1 and the irradiation optical system 51 constitute the light irradiation device for irradiating the target photomask 52. The light which was irradiated like this and transmitted through the photomask 52 contains an image of a device pattern drawn on the photomask 52, and this light is irradiated onto a predetermined position on the semiconductor wafer 55 mounted on the stage 56 via the projection optical system 54. At this time, an image of the device pattern of the photomask 52 is reduced and exposed on the semiconductor wafer 55 by the projection optical system 54.

According to the exposure device 50 of this embodiment, noise light is decreased in the light source light L3 from the light source device 1, and S/N increases, therefore the transfer accuracy of the mask pattern of the photomask 52 is enhanced. By operating the trigger pulse variable delay unit 15 of the light source device 1, to minimize the spectral width of the light source light L3, the image forming characteristics of the projection optical system improve, and the transfer accuracy of the mask pattern of the photomask 52 is enhanced here as well.

In a device manufacturing method according to an embodiment of the present invention, a semiconductor device is manufactured through: a step of designing function and performance of the device; a step of forming a wafer from silicon material; a lithography step including a step of exposing the semiconductor wafer 55 via a photomask 52 by the exposure device 50 according to the second embodiment; a step of forming a circuit pattern, including etching; a step of assembling the device (including a dicing step, bonding step and packaging step); and a step of inspection. The present invention can be applied not only to an exposure device for manufacturing semiconductor devices, but also to an exposure device for manufacturing various other devices.

Each embodiment of the present invention was described, but the present invention is not limited to these embodiments.

For example, needless to say the wavelength of the light source light L3 from the light source device 1 is not limited to 193 nm. The exposure device 50 according to the second embodiment was described as a device to which the light irradiation device of the present invention is applied, but the light irradiation device of the present invention can be used for various other devices, including various optical inspection devices and laser treatment devices.

EXPLANATION OF NUMERALS AND CHARACTERS 1 light source device
11 DFB-LD
12 EOM
15 trigger pulse variable delay unit
10 seed light generation device
20 light amplification unit
30 wavelength conversion unit
50 exposure device
51 irradiation optical system
54 projection optical system

What is claimed is:

1. A light source device, comprising:
a seed light generation device which generates seed light to be optically amplified;
a light amplification unit which optically amplifies the seed light generated by the seed light generation device; and
a wavelength conversion unit which converts a wavelength of the light optically amplified by the light amplification unit, and outputs ultraviolet pulsed light,
the seed light generation device including:
a pulse generation unit which generates pulsed light having a single wavelength;
a pulse modulation unit which selectively passes and extracts a part of the pulsed light; and
a timing adjustment unit which adjusts a spectral width of the ultraviolet pulsed light to be output from the wavelength conversion unit by adjusting the extracting timing of the pulsed light by the pulse modulation unit during the generation period of the pulsed light by the pulse generation unit, according to an operation, wherein
the timing adjustment unit adjusts the extracting timing during the generation period to a range that includes a timing when a light intensity decreases.

2. The light source device according to claim 1, wherein the pulse generation unit is a laser diode which generates the pulsed light in response to a pulsed electric signal.

3. A method for adjusting the light source device according to claim 1, comprising:
operating the timing adjustment unit so that the spectral width of the ultraviolet pulsed light output from the wavelength conversion unit becomes a desired spectral width, while observing the spectral width of the ultraviolet pulsed light.

4. A light irradiation device for irradiating light onto an object, comprising:
the light source device according to claim 1; and
an irradiation optical system which irradiates ultraviolet pulsed light from the light source device onto the object.

5. An exposure device for transferring a pattern of a mask onto a photosensitive object, comprising:
the light source device according to claim 1;
an irradiation optical system which irradiates ultraviolet pulsed light from the light source device onto the mask; and
a projection optical system which projects the ultraviolet pulsed light from the mask onto the photosensitive object.

6. A device manufacturing method including a lithography step,
the lithography step comprising using the exposure device according to claim 5 to transfer a pattern of the mask onto the photosensitive object.

7. An exposure device for transferring a pattern of a mask onto a photosensitive object, comprising:
the light source device according to claim 2,
an irradiation optical system which irradiates ultraviolet pulsed light from the light source device onto the mask; and
a projection optical system which projects the ultraviolet pulsed light from the mask onto the photosensitive object.

8. The light source device according to claim 1, wherein the spectral width reaches a minimum value when the light intensity is decreasing.

9. The light source device according to claim 8, wherein:
the spectral width is defined as the width where 95% of the energy of the whole spectral concentrates; and
the minimum value is 2.5 pm.

* * * * *